United States Patent
Zait et al.

(10) Patent No.: US 7,459,242 B2
(45) Date of Patent: Dec. 2, 2008

(54) METHOD AND SYSTEM FOR REPAIRING DEFECTED PHOTOMASKS

(75) Inventors: Eitan Zait, Kibbutz Hanita (IL); Vladimir J. Dmitriev, Karmiel (IL); Sergey V Oshemkov, Karmiel (IL); Nikolay N. Guletskiy, Karmiel (IL); Guy Ben-Zvi, Har Halutz (IL)

(73) Assignee: Pixer Technology Ltd., Karmiel (IL)

( * ) Notice: Subject to any disclaimer, the term of this patent is extended or adjusted under 35 U.S.C. 154(b) by 784 days.

(21) Appl. No.: 10/504,866

(22) PCT Filed: Dec. 12, 2002

(86) PCT No.: PCT/IL02/01001

§ 371 (c)(1),
(2), (4) Date: Aug. 17, 2004

(87) PCT Pub. No.: WO03/071358

PCT Pub. Date: Aug. 28, 2003

(65) Prior Publication Data

US 2005/0084767 A1 Apr. 21, 2005

Related U.S. Application Data

(60) Provisional application No. 60/358,468, filed on Feb. 20, 2002.

(51) Int. Cl.
*G03F 1/00* (2006.01)
*G03C 5/00* (2006.01)

(52) U.S. Cl. .............................. 430/5; 430/30
(58) Field of Classification Search .................. 430/5, 430/30; 438/22, 29
See application file for complete search history.

(56) References Cited

U.S. PATENT DOCUMENTS 5,686,206 A 11/1997 Baum et al.
(Continued)

FOREIGN PATENT DOCUMENTS

WO WO 02/16969 2/2002
WO WO 03/022506 3/2003

OTHER PUBLICATIONS

Haight et al, "Implementation and Performance of a Femtosecond Laser Mask Repair System in Manufacturing", 1998, pp. 477-484.
Haight et al, "MARS: Femtosecond Laser Mask Advanced Repair System in Manufacturing", Journal of Vacuum Science & Technology B, Nov./Dec. 1999 pp. 3137-3143.

*Primary Examiner*—Stephen Rosasco
(74) *Attorney, Agent, or Firm*—Pearl Cohen Zedek Latzer LLP

(57) ABSTRACT

A system and method for repairing a photomask (52) for use in a photolithography process is disclosed, the photomask (52), consisting of a substrate layer (38) and a chrome layer (36) over the substrate layer (38), having a defect (42) in the chrome layer (36), the method comprising: providing a pulsed laser source (1) for generating an ultra-short pulsed laser beam; providing optical elements for scanning, directing and focusing the pulsed laser beam at a desired target location; directing the pulsed laser beam through the substrate and focusing it on a target location located inside the substrate adjacent the defect (42) to write a diffractive optical element (34), thus changing the scattering properties of the substrate at the target location.

9 Claims, 3 Drawing Sheets

U.S. PATENT DOCUMENTS

| | | |
|---|---|---|
| 6,028,953 A | 2/2000 | Nakamura et al. |
| 6,165,649 A | 12/2000 | Grenon et al. |
| 6,333,485 B1 * | 12/2001 | Haight et al. .......... 219/121.68 |
| 6,341,009 B1 | 1/2002 | O'Conner et al. |
| 6,346,352 B1 | 2/2002 | Hayden et al. |
| 6,436,602 B1 | 8/2002 | Imahara et al. |
| 6,929,886 B2 * | 8/2005 | Zait et al. ...................... 430/5 |
| 2003/0127441 A1 * | 7/2003 | Haight et al. .......... 219/121.84 |

* cited by examiner

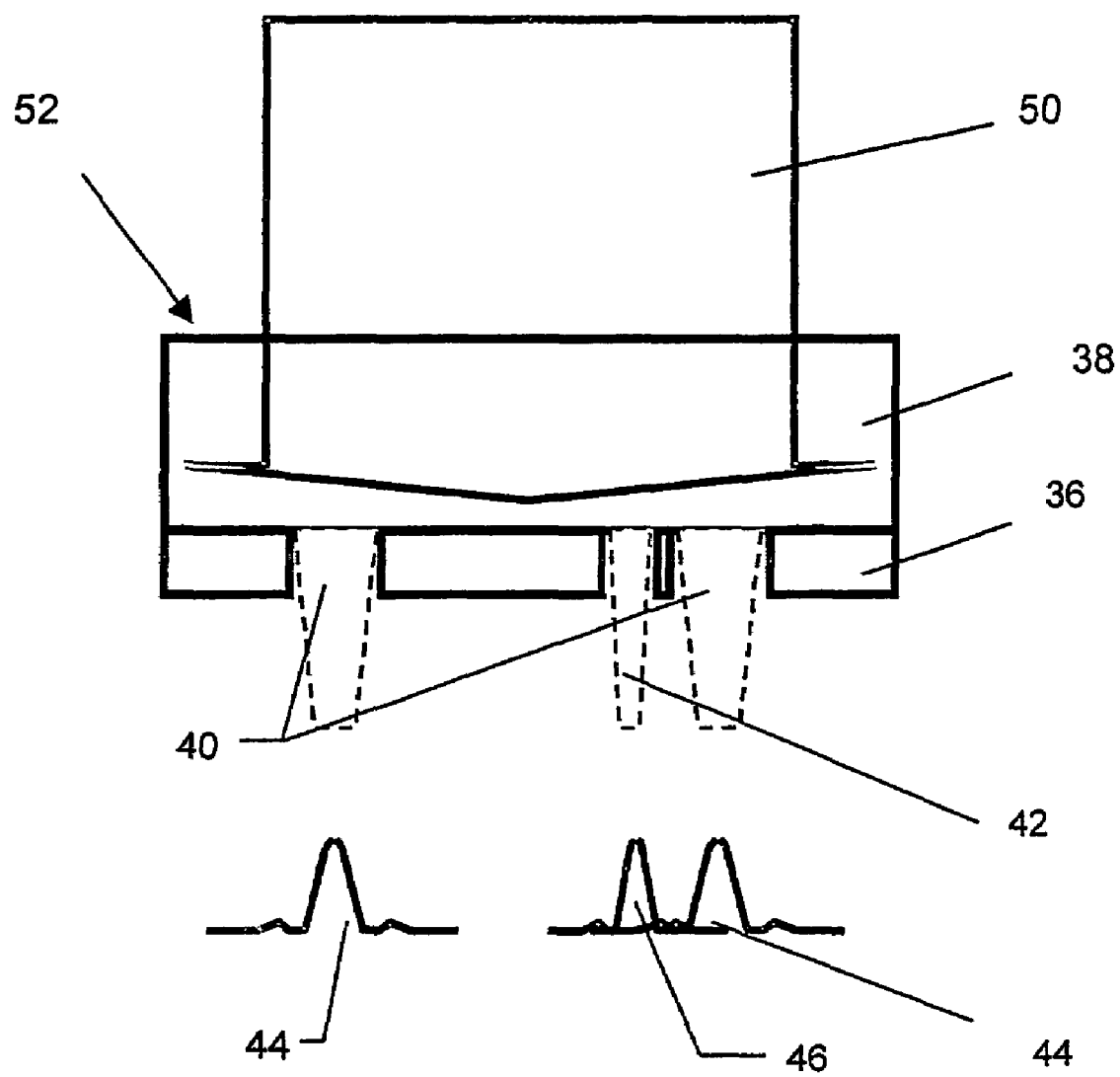

METHOD AND SYSTEM FOR REPAIRING DEFECTED PHOTOMASKS

This application is a National Phase Application of PCT International Application No. PCT/IL02/01001, International Filing Date Dec.12, 2002, claiming priority of U.S. Provisional Patent Application, 60/358,468 filed Feb. 20, 2002.

FIELD OF THE INVENTION

The present invention relates to photomask repair, and more particularly to a method and system for repairing defected photomasks using pulsed laser.

BACKGROUND OF THE INVENTION

Integrated Circuits (IC) surround us today and are present in almost every device, apparatus or accessory. Generally IC's consist of a variety of electronic components constructed as a single piece of semiconductor, built up in layers, manufactured in a process called "photolithography".

In photolithography a semiconductor wafer (usually made from silicon) is first coated with a photoresist (light-sensitive) layer. Then, the coated wafer is exposed to a predetermined pattern of light that is acquired by passing light (laser or lamp light) through a reticle (sometimes called "mask")—a blank, usually made form fused silica (quartz) or silicon dioxide, having an engraved pattern on it. Lastly, the irradiated wafer undergoes chemical development—washing off the wafer to remove the exposed (or unexposed) coating, depending on positive or negative photoresist type, and etching cuts through the wafer's uncoated areas.

Photo masks used for integrated circuits (IC) manufacturing are commonly composed of a chrome layer deposited on quartz or fused silica plates, which are subsequently patterned for a photolithographic process.

In a photolithographic process, ultraviolet (UV) light passes through the patterned Chrome, and an image is formed within the Photoresist layer on top of a Silicone wafer.

It is essential that the chrome layer of the mask be defect free, with no voids, pinholes or scratches, so that there are no parasitic defects printed onto the Photoresist layer of the wafer in the photolithograpic process, for defects in the chrome layer of the photomask inevitably and ultimately result in defects in the produced IC wafer.

The chrome layer is occasionally accompanied by additional layers, such as protective layers, antireflective layers etc.

IC manufacturing steps include two different major phases— Front line or front-end, and back-end. The first phase includes all printing steps on Silicone wafers, and the latter includes the final integration into the chip package, in particular for "flip-chip" technology.

Front-end processes require sub-micron resolution, typically with an optical demagnification factor of 1:4, where the back-end masks resolving power is normally more then 10 times less (above few microns) with optical magnification of 1:1 for the printing of conductive "bumps".

Additional applications similar to IC back-end masks are the lithographic processes for LCD (liquid crystal displays) or FPD (flat panel displays), and the thin film magnetic read/write heads used in disk drives for personal computers.

Non-uniformity in some mask steps, such as with contact-holes diameters, is also a widely spread defect, which needs to be addressed by a repair mechanism.

A structure of pixels inside the transparent quartz mask, with a correct design, can ultimately control the amount of UV energy transmitted by mask contact-holes and Vias, to the required level.

One well-known mask repair technology used for front-end masks is the Ion beam deposition (mostly with Gallium or Carbon ion sources).

However, such a system is highly complex, equipment cost is high, and problems of Gallium ions stains and Quartz damage are unavoidable.

Therefore it is not suitable for the back-end masks repair, and cost to performance ratio is questionable for front-end masks.

A second repair method, first published in 1998 (R.Haight et al: SPIE 3546, 477 (1998)) and 1999 (Haight et al: MARS: Femtosecond laser mask advanced repair system in manufacturing. Journal of vacuum science & technology B, November/December 1999, p. 3137) featured a Femtosecond pulsed laser system, used at an ablation mode, for direct Chrome removal only.

In Such a system, laser beam is directed above the Chrome coating side, and the glass substrate is not processed. No scanning system is provided for the laser beam, and it is limited in speed, hence cannot generate complex 3D patterns, for it consists of only a 3 axis moving stage for positioning. Only Chrome ablation process is performed.

Economical mask repair technologies for back-end masks are currently not available, or too complex to be implemented.

For front-end mask repair, Ion-beam is sometimes used, however, there are no simple and low-cost systems which can handle Chrome voids, pinholes etc.

SUMMARY OF THE INVENTION

There is thus provided, in accordance with a preferred embodiment of the present invention, a method for repairing a photomask for use in a photolithography process, the photomask, consisting of a substrate layer and a chrome layer over the substrate layer, having a defect in the chrome layer, the method comprising:

providing a pulsed laser source for generating an ultra-short pulsed laser beam;

providing optical elements for scanning, directing and focusing the pulsed laser beam at a desired target location;

directing the pulsed laser beam through the substrate and focusing it on a target location located inside the substrate adjacent the defect to write a diffractive optical element, thus changing the light scattering properties of the substrate at the target location.

Furthermore, in accordance with a preferred embodiment of the present invention, the diffractive optical element is a shading element.

Furthermore, in accordance with a preferred embodiment of the present invention, the diffractive optical element is a phase-shifting element.

Furthermore, in accordance with a preferred embodiment of the present invention, the diffractive optical element comprises micro cracks in the substrate.

Furthermore, in accordance with a preferred embodiment of the present invention, the diffractive optical element is produced by locally changing the refractive index of the substrate at the target location.

Furthermore, in accordance with a preferred embodiment of the present invention, the pulsed laser source is an ultra-short pulsed laser source.

Furthermore, in accordance with a preferred embodiment of the present invention, the ultra-short pulsed laser source is a femto-second laser source.

Furthermore, in accordance with a preferred embodiment of the present invention, the diffractive optical element is produced in a tapered shape, the narrower end of the tapered shape being nearer to the chrome layer.

Furthermore, in accordance with a preferred embodiment of the present invention, the diffractive optical element is conically shaped.

Furthermore, in accordance with a preferred embodiment of the present invention, the diffractive optical element is pyramid-shaped.

Furthermore, in accordance with a preferred embodiment of the present invention, the diffractive optical element having the tapered shape is made of layers of pixels, each layer consisting of an array of pixels patterned with a predetermined energy and density and geometry.

Furthermore, in accordance with a preferred embodiment of the present invention, there is provided a system for repairing a photomask for use in a photolithography process, the photomask consisting of a substrate layer and a chrome layer over the substrate layer, having a defect in the chrome layer, the method comprising:

a pulsed laser source for generating an ultra-short pulsed laser beam;

optical elements for scanning, directing and focusing the pulsed laser beam at a desired target location within the substrate;

an in-situ machine vision system for viewing a field of view including the target location;

a control unit is provided for controlling and monitoring operation of the system, whereby the system is capable of writing a diffractive optical element at a target location within the substrate adjacent to the defect, thus changing the light scattering properties of the substrate at the target location.

Furthermore, in accordance with a preferred embodiment of the present invention, the pulsed laser source is an ultra-short pulsed laser source.

Furthermore, in accordance with a preferred embodiment of the present invention, the ultra-short pulsed laser source is a femtosecond laser source.

Furthermore, in accordance with a preferred embodiment of the present invention, the pulsed laser source provides laser beam whose frequency is made to range between 190 to 900 nm.

Furthermore, in accordance with a preferred embodiment of the present invention, the in-situ machine vision system shares some of the optical elements, so that writing is directly viewed by the in-situ machine vision system.

Furthermore, in accordance with a preferred embodiment of the present invention, the system further includes low magnification optics for locating and positioning of defects in the photomask in front of the pulsed laser beam.

Furthermore, in accordance with a preferred embodiment of the present invention, the system is further provided with harmonics generator, and a variable attenuator for controlling output energy of the pulsed laser beam.

Furthermore, in accordance with a preferred embodiment of the present invention, the system is provided with a scanner, for scanning the pulsed laser beam.

Furthermore, in accordance with a preferred embodiment of the present invention, the scanner is selected from the group including: galvo-scanner, piezo-electrically actuated scanner, acousto-optic deflector.

Furthermore, in accordance with a preferred embodiment of the present invention, a moving stage is provided for moving the photomask under the pulsed laser beam.

Furthermore, in accordance with a preferred embodiment of the present invention, the moving stage is a 3-axis moving stage.

Furthermore, in accordance with a preferred embodiment of the present invention, a light source is provided for illuminating the photomask.

Furthermore, in accordance with a preferred embodiment of the present invention, the light source is further provided with a light guide and a variable aperture stop.

Furthermore, in accordance with a preferred embodiment of the present invention, the optical elements include beam-splitter, objective lens, tube-lens, condenser lens.

Furthermore, in accordance with a preferred embodiment of the present invention, the system is further provided with a CCD camera, wherein an image recorded by the CCD camera is grabbed by a frame grabber and processed by the control unit to analyze the defect.

Furthermore, in accordance with a preferred embodiment of the present invention, a computerized program is provided for determining the position, orientation and dimensions of the defect.

Furthermore, in accordance with a preferred embodiment of the present invention, the computerized program optionally converts the defect into a map of pixels.

Furthermore, in accordance with a preferred embodiment of the present invention, the computerized program takes into account the dimensions and orientation of the defect, Fresnel diffraction, and the scattering nature of patterned pixels written by the pulsed laser source, to determine shape, orientation and position of the diffractive optical element.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

FIG. 1a illustrates a sectioned view of a photomask with a defect in the form of a void in the chrome layer of the photomask.

DETAILED DESCRIPTION OF PREFERRED EMBODIMENTS

Figure 1B:
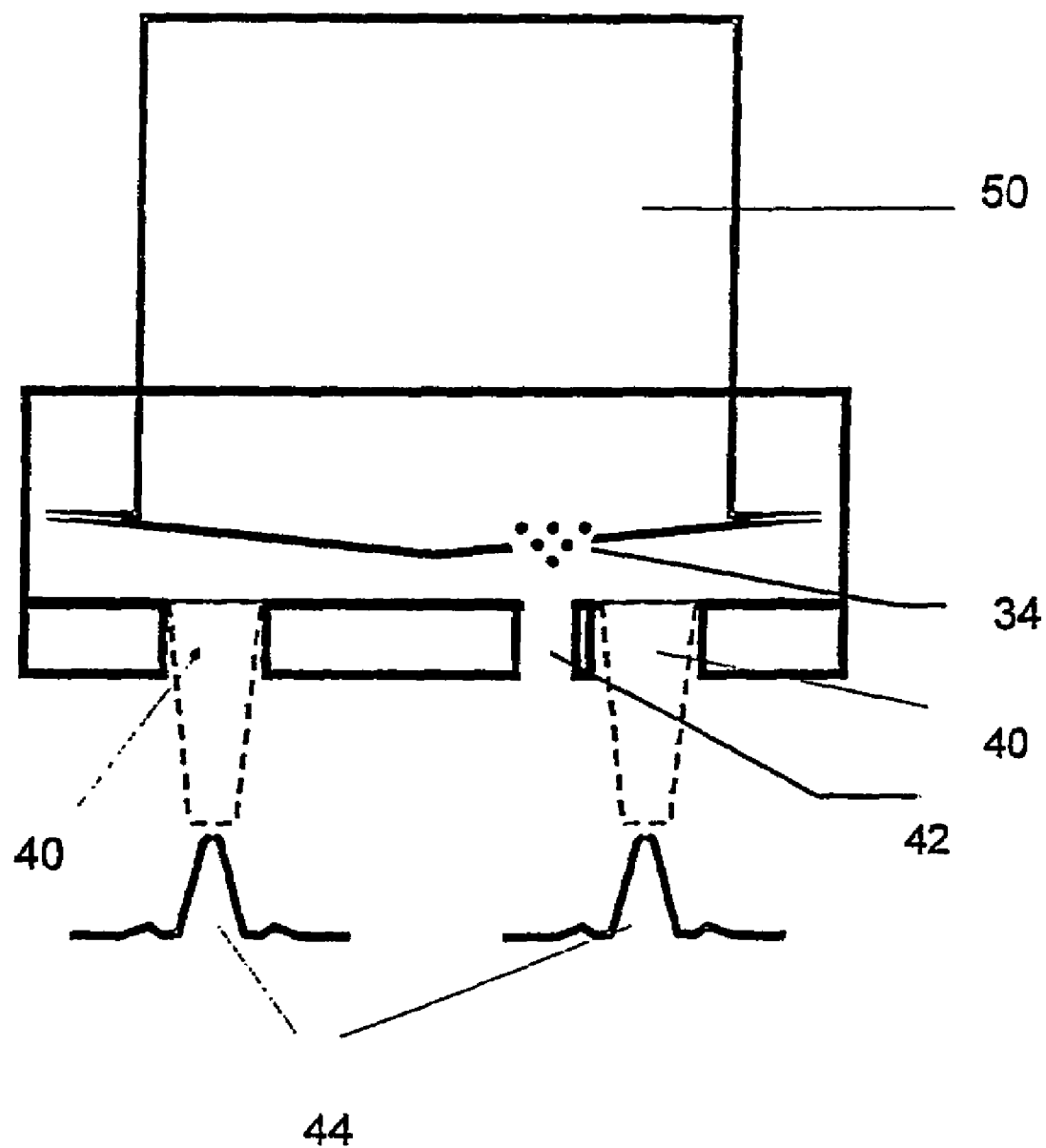
FIG. 1b illustrates the photomask of FIG. 1a after having undergone a treatment in accordance with a method for repairing a photomask according to a preferred embodiment of the present invention, where a diffractive optical element or shading element (DOE/SE) is introduced within the substrate adjacently in front of the void (like a scratch) in the chrome layer.

An aspect of the present invention is repairing a damaged photomask-mask with undesired defect, be it due to a scratch, hole, lack of material, excessive material or other unintentional reason, in the chrome layer (other than the desired pattern-by writing a diffractive optical element (DOE) or a shading element (SE) in front of the undesired defect. This serves to effectively block, diffract or divert light irradiation as the mask is irradiated in the IC manufacturing process. This way the irradiated light in the IC manufacturing process is redistributed to overcome the defect, so that the desired pattern is printed correctly onto the wafer. The DOE/SE structure design is aimed at casting a shadow or change the scattering properties of the substrate adjacent a void or pin-hole scratches, or any other defect in Chrome layer of the photo masks. Throughout this specification, the term "DOE" (diffractive optical element) means all types of diffractive elements and also includes effectively blocking elements-hereinafter referred to as shading elements (SE). By "writing" it is meant, in the context of the present invention, using laser energy to change the scattering properties of the material, such as changing the index of refraction, or creating some level of absorption, or producing micro-cracks in the material, etc.

The pulsed laser beam is irradiated onto the substrate side of the photomask (i.e. not through the chrome layer), and focused at a target location adjacent the defect, within the substrate.

Reference to the drawings is made for a better understanding of the preferred embodiment and the main aspects of the present invention, but in no way does it limit the scope of the present invention.

A general purpose laser station (see FIG. 2) is equipped with a fast femtosecond laser 1 capable of delivering short laser pulses, typically at about 100 femtosecond (fs), but below 10 Pico seconds of duration, at energies high enough to create a local change in the index of refraction or locally change the scattering properties of the mask substrate, and/or the formation of damage zones with a high enough level of scattering and absorption, to enable a proper design of a diffractive optics element (DOE) and/or a shading element (SE).

The design of DOE or SE is dictated by the effective optical density required, in order to eliminate the defects from being printed on to the wafer in the photolithographic process.

Femtosecond laser pulses focused in close proximity to the chrome layer is an additional factor which affects the DOE design.

The pulses are preferably focused through the substrate and in front of the chrome layer. The DOE/SE structures over the chrome is preferably in a tapered shape, such as conical or pyramid shapes (but also other tapered shapes are possible), with the narrower end nearer the chrome layer. This is done to prevent damage to the chrome layer by the femtolaser pulses, and also to ensure correct ray tracing of UV light through the mask when the mask is used.

FIG. 1a illustrates a sectioned view of a photomask with a defect in the form of a void in the chrome layer of the photomask. The photomask 52 comprises a substrate layer 38 (usually made of quartz) over which a chrome layer 36 is provided. In the manufacturing process of the photomask, portions of the chrome layer are removed, in a predetermined pattern 40, in order to allow using of the photomask as a "negative" (or "positive") through which light is irradiated on a wafer during the photolitographic process. During the manufacruting process, or at a later stage, the photomask may be subjected to damage in the form of unintentional chrome removal (where it is undesired), leaving a void 42 in the form of a scratch or a pinhole in the chrome layer. As a result, during the photolitographic process, when the photomask is irradiated, light may pass through the defect, as well as through the predetermined pattern, causing the appearance of a parasitic signal 46, beside the desired printing signal 44.

FIG. 1b illustrates the photomask of FIG. 1a after having undergone a treatment in accordance with a method for repairing a photomask according to a preferred embodiment of the present invention, where a diffractive optical element or shading element (DOE/SE) is introduced within the substrate adjacently in front of the void (like a scratch) in the chrome layer. A diffractive optical element (DOE) 34 is introduced within the quartz substrate 38 over the void 42 in the chrome layer 36. Thus when a beam of light 50 is irradiated on the photomask in the photolithographic process, the DOE 34 provides an effective obstruction to the beam and effectively preventing the printing of the void onto the IC.

In reference to FIG. 1b, the DOE structure, defined by the laser pixels is designed in a tapered srtucture, with the narrow end closer to the chrome layer. It is constructed by adding pixel layers, each layer with more pixels than the layer beneath, progressing in several layers in order to scatter and absorb light to the required shading level, so that transmission of UV light is blocked by the DOE/SE or attenuated to the required level-below the resist printing threshold (the threshold of the resist layer under which it is not affected by irradiation in the photolithography process).

SE/DOE elements are constructed by layers of pixels. Each layer is an array of pixels patterned with a predetermined energy and density and geometry. The layers are built with increasing size, so that 3 dimensional tapered shapes are created like conical or pyramide (but not limited to those shapes only). SE shapes are predetermined by both void size and Fresnel diffraction pattern near the void.

Figure 2:
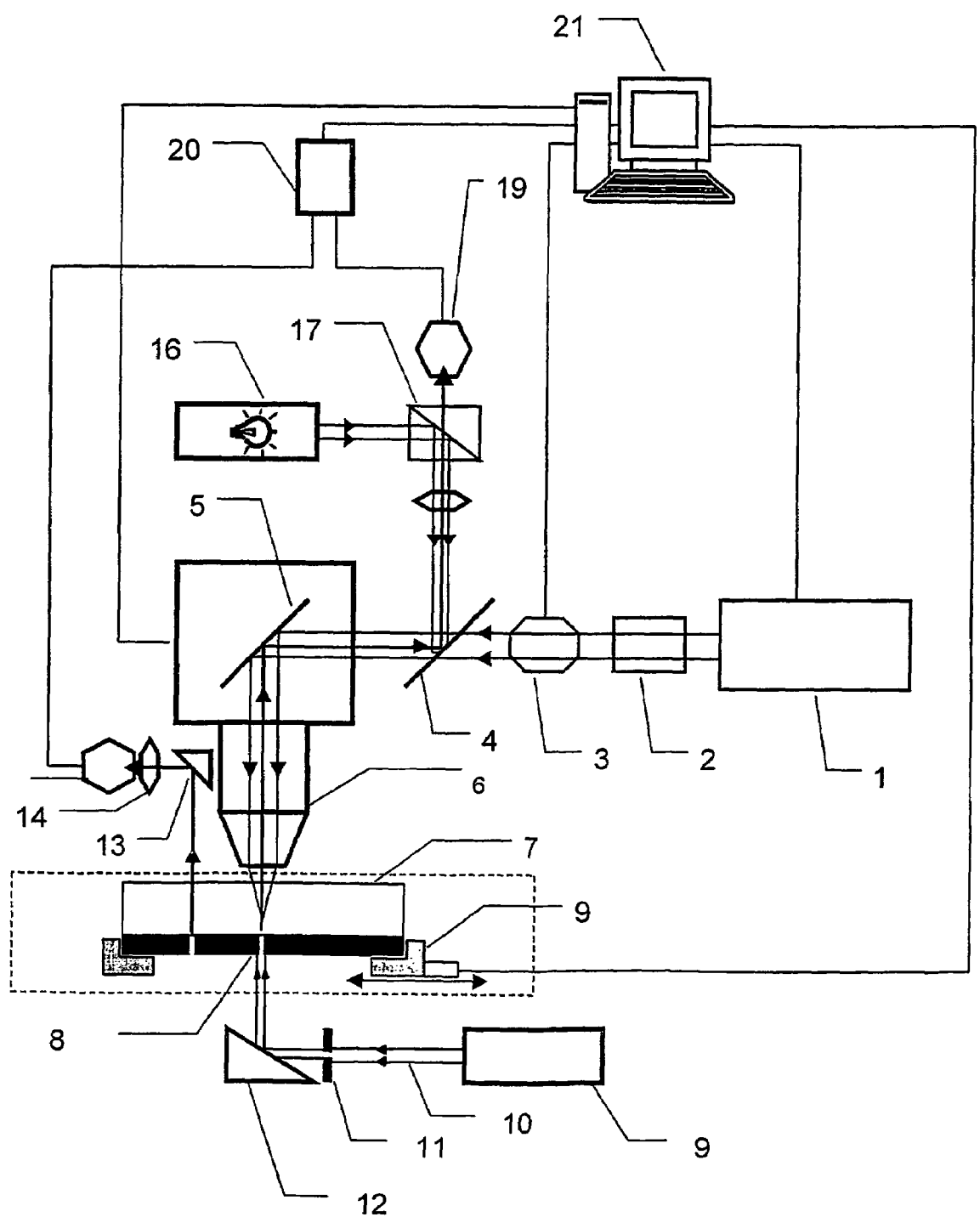
FIG. 2 illustrates a system for repairing a photomask in accordance with a preferred embodiment of the present invention.

FIG. 2 illustrates a system for repairing a photomask in accordance with a preferred embodiment of the present invention.

Generally, the system for repairing a photomask in accordance with the present invention comprises an ultra-short pulsed femtosecond laser source and optics for directing and focusing the beam generated by the laser source, an in-situ machine vision system, optionally sharing at least some of the optics of the laser system so that writing by the laser system is directly viewed and monitored by the in-situ machine vision system, optional low magnification optics for locating and positioning of defects in the treated photomask in front of the pulsed laser beam, and control unit that monitors and controls the operation of the entire system.

In reference to FIG. 2, the system comprises an ultra-short pulsed femtosecond laser 1, where a central computerized control unit 21 controls pulses timing.

Laser pulse fundamental frequency is preferably multiplied to higher harmonics by a harmonics generator 2, followed by a variable attenuator 3, which controls output energy.

Attenuated laser beam is directed into a scanner, such as a galvo-scanner or a piezo-electric actuator type scanner or an acousto-optic deflector 5, which is synchronized with laser pulses timing and with a 3-axis moving stage 9, by the central computerized control unit 21.

Subsequently the beam is focused by main objective lens 6 into the photo mask glass substrate side 7.

The same objective lens 6 is used for an in-situ machine vision system which acts as a microscope with high magnification.

The mask is illuminated by a light source 9 via a light guide 10, and a variable aperture stop 11.

Stop shape and diameter are chosen to match the numerical aperture and illumination mode of the lithographic process, which will eventually use the repaired mask shading elements.

Light is collimated via a condenser lens onto the patterned chrome layer of the mask 8.

An image is eventually formed via objective 6, beam-splitter 4, and a tube-lens, which directs the light to CCD camera 19.

Image is grabbed by a continuous frame-grabber 20, and processed at central computerized control unit 21.

A reflected light system 16 for the high magnification facilitates better illumination for focusing and adds more imaging information on the defects to be repaired.

Each defect image is grabbed by the optical system, which is the same one for directing the laser beam.

The grabbed image of the defect is passed into mapping software, which determines the position, orientation and dimensions of the defect, and optionally converts it into a map of pixels.

An Algorithm, which takes into account the void dimensions, Fresnel diffraction, and the scattering nature of the laser's patterned pixels, is preferably used, determining the shape, orientation and position of the required shadow (DOE/SE), on all void types of geometries and positions. Such an algorithm was disclosed in WO 02/16969 A2, PCT/IL01/00789, incorporated herein by reference.

The in-situ machine vision system uses the same optical axis of the laser beam separated by beam-splitter 4, so that positioning and shading levels are monitored and controlled throughout the process by CCD camera 19, communicating with the central computerized control unit 21 (via frame grabber 20).

The in-situ machine vision system preferably includes two optical magnifications. The high magnification is separated from the laser track by a beam-splitter 4, and the image is formed via a tube-lens, onto a CCD camera 19.

Low magnification imaging 15 with its relay optics 13, 14, is set for a wide field of view for positioning and alignment of the mask on an X.Y.Z stage 9. moving stage.

Both magnifications are equipped with a transmission mode illumination system 9.

At laser pulses repetition rate of 1 KHz, one shading element with few thousand pixels, may take few tens of seconds per defect to produce.

Therefore, this method and system of the present invention enable a fast and simple process of repairing defects on photomasks for both back-end and front-end applications.

The SE structure design provides a shadow over a void, pinhole, scratches, or any other defect at the Chrome layer of the photo-masks.

The design of the DOE or a the shading element, is dictated by the effective optical density required, in order to eliminate the defects from being printed on to the wafer, by effectively blocking or attenuating the irradiated light, in the IC manufacturing process, from printing on the wafer.

However the diffractive optical element of the present invention does not necessarily have to be a shading element. The DOE may be for example a phase-shifting element for correction of a small defect, such as missing chrome or excess of chrome. See for example PCT/IL02/00407, on how to write phase-shift elements. Optionally and alternatively, changing of the refractive index at the target location, or concentrating enough laser energy at the target location to produce micro-cracks in the substrate, may render it a diffractive optical element suited for the job.

Laser wavelengths of 190-900 nanometers are recommended but the system and method of the present invention are not limited to that range.

High-energy femtosecond lasers with a regenerative amplifier (such as CPA-2001 from Clark-MXR, Mich., U.S.A.) radiates at 775 nm, however, when followed by a second harmonic generator (SHG) or higher harmonics, wavelengths of 385 nm, less are achieved respectively.

Shorter wavelengths may add the advantage of lower threshold energies for the process, with smaller pixel size for enhanced resolution. For repetition rate of 1000 Hz, and with a fast Galvo-scanner, it is a normal practice, to pattern a line of 1000 microns of length, at about one second.

The laser beam is preferably focused by an optical system with a high NA of at least 0.3. But preferably-over 0.5, to achieve localized small pixels with a short enough depth of focus for patterning inside transparent layers.

For fast operation and three-dimensional pattern generation, laser beam steering is performed by a high-speed galvo-scanner, synchronized with a fast moving X,Y, stage, and laser pulses timing.

The whole process is controlled by a high magnification continuous vision system, on the same optical axis of the laser beam.

The vision system preferably covers a field of view of 120 microns, but this is merely a recommendation and not a limitation to the present invention. When defects are larger then the above field of view, clusters of pixels are combined with X,Y, stage movements. By employing ultra-short laser pulses of Pico second or Femtosecond duration, there are three major phenomena, which may result: scattering centers around the damage zones, absorption and phase modulation.

Pico second duration pulses at the range of 10 to 100 Pico seconds create damage zones on the order of 5 to 50 microns of lateral dimension and light is scattered and partially absorbed.

As a result, most Chrome defects cannot be repaired accurately enough.

Femtosecond pulses, with energies of few micro-joules and below, can reach pixel size of less then 0.5 micron.

When using 150 femtosecond duration pulses, at threshold energy of less then 1.0 micro joules, we achieved clear cut images of sub micron pixel sizes, measured with a phase-contrast microscope.

The third phenomena of phase modulation, is a result of femto-second pulses, at energies below ~0.5 micro joules, with high N.A. optics, the index of refraction of the transparent layer is modified.

At focus, the laser pulses create localized plasma by a nonlinear absorption of the radiation.

As a result of that, density and structural changes inside the transparent media lead to modification of SiO2 index of refraction, and therefore, to phase modulation of light transmitted through the structure.

It should be clear that the description of the embodiments and attached Figures set forth in this specification serves only for a better understanding of the invention, without limiting its scope.

It should also be clear that a person skilled in the art, after reading the present specification could make adjustments or amendments to the attached Figures and above described embodiments that would still be covered by the scope of the present invention.

The invention claimed is:

1. A method for changing the optical properties of a photomask for a photolithography wafer production process, wherein the wafer has a photoresist thereon and the photomask has a substrate layer and a coating layer over the substrate layer, the method comprising:

provide a pulsed laser source for generating an ultra-short pulsed laser beam;

providing optical elements for scanning, directing and focusing the pulsed laser beam at a desired target location; and directing the pulsed laser beam through the substrate and focusing it on a target location located inside the substrate adjacent the coating layer; and writing a diffractive optical element, said diffractive optical element comprising a shading element to attenuate the ultraviolet light passing through the photomask below the photoresist printing threshold of the wafer.

2. The method as claimed in claim 1, wherein the diffractive optical element comprises micro cracks in the substrate.

3. The method as claimed in claim 1, wherein the diffractive optical element is produced by locally changing the refractive index of the substrate at the target location.

4. The method as claimed in claim 1, wherein the pulsed laser source comprises an ultra-short pulsed laser source.

5. The method as claimed in claim 4, wherein the ultra-short pulsed laser source comprises a femto-second laser source.

6. The method as claimed in claim 1, wherein the diffractive optical element is produced in a tapered shape, the narrower end of the tapered shape being nearer to the coating layer.

7. The method as claimed in claim 6, wherein the diffractive optical element is conically shaped.

8. The method as claimed in claim 6, wherein the diffractive optical element is pyramid-shaped.

9. The method as claimed in claim 6, wherein the diffractive optical element comprises layers of pixels, each layer comprising an array of pixels patterned with a predetermined energy and density and geometry.

* * * * *